(12) United States Patent  
Cunningham et al.

(10) Patent No.: US 7,857,688 B1  
(45) Date of Patent: Dec. 28, 2010

(54) ELECTRICAL CABINET HAVING MULTI-CHANNEL EXHAUST WITH BLEEDING VENTS TO ALLEVIATE BACK-PRESSURE

(75) Inventors: W. Brian Cunningham, Westborough, MA (US); John K. Bowman, Brighton, MA (US); Steven R. Cieluch, Allston, MA (US); C. Ilhan Gundogan, Lexington, MA (US); Gerald J. Cote, Upton, MA (US)

(73) Assignee: EMC Corporation, Hopkinton, MA (US)

( * ) Notice: Subject to any disclaimer, the term of this patent is extended or adjusted under 35 U.S.C. 154(b) by 631 days.

(21) Appl. No.: 11/608,952

(22) Filed: Dec. 11, 2006

(51) Int. Cl.  
*H05K 5/00* (2006.01)  
*H05K 7/20* (2006.01)

(52) U.S. Cl. ............ 454/184; 361/695; 361/693; 361/687; 361/690; 361/694

(58) Field of Classification Search ............ 454/184; 361/695, 693, 687, 690, 694; 165/80.2, 122  
See application file for complete search history.

(56) References Cited

U.S. PATENT DOCUMENTS

| 7,046,513 | B2* | 5/2006 | Nishiyama et al. ............ 361/695 |
| 7,372,695 | B2* | 5/2008 | Coglitore et al. ......... 361/679.48 |
| 7,499,273 | B2* | 3/2009 | Casebolt ................. 361/679.48 |
| 7,508,663 | B2* | 3/2009 | Coglitore ..................... 361/695 |
| 2007/0220912 | A1* | 9/2007 | Miyamoto et al. .......... 62/259.2 |

\* cited by examiner

*Primary Examiner*—Steve McAllister  
*Assistant Examiner*—Helena Kosanovic

(57) ABSTRACT

A cabinet having a pair of vertically stacked chassis separated by a central, vertically extending region. A pair of laterally spaced, vertically extending panels is disposed in the central region, the panels forming: a pair of outer compartments for receiving air exiting a corresponding one of the pair of laterally spaced vertically stacked chassis; and an inner compartment for receiving air exiting the pair of vertically stacked chassis. The panels have therein an array of openings in a lower portion thereof for passing portions of air in the outer compartments into the inner compartment. An upper portion of the panels inhibits portions of air in the outer compartments from passing into the inner compartment. The openings extend in rows horizontally across the panel. The number of opening in lower ones of the rows is greater than the number of opening in upper ones of the rows.

14 Claims, 5 Drawing Sheets

ELECTRICAL CABINET HAVING MULTI-CHANNEL EXHAUST WITH BLEEDING VENTS TO ALLEVIATE BACK-PRESSURE

TECHNICAL FIELD

This invention relates generally to electrical cabinets and more particularly to ventilation systems used in such cabinets to cool electrical components housed in rack-mounted chassis stored in such cabinets.

BACKGROUND AND SUMMARY

As is known in the art, electrical cabinets have been used to house rack-mounted modular chassis for many applications, such as in data storage systems. In one rack-mounted system, a cabinet is provided having a pair of vertically stacked columns of modular chassis separated by a central, vertically extending region. That is, the modular chassis are located in the front and rear of a rack in two vertical columns with the chimney in the center of the rack. The central region serves as a common ventilation chimney for the pair of stacks of chassis. More particularly, fans in the chassis draw air into the front of the chassis to then cool electrical components in the chassis then exit through the rear of the chassis into the common chimney where the air is then directed upwards out of the cabinet. The inventors have discovered that as the number of chassis in the rack increases, with all of these chassis exhausting into the same chimney, immense back pressure can incurred in the lower portions of the chimney thereby impeding effective exhaust for the lower chassis in the rack. The main disadvantage is that the chassis in the lower portion of the rack cannot exhaust their air. This will prevent them from operating at their optimal performance or overheat. This could be overcome by overbuilding the cooling systems. This would be very expensive and would require extra space within the rack.

In accordance with the present invention, a cabinet is provided having a pair of vertically stacked chassis separated by a central, vertically extending region. A pair of laterally spaced, vertically extending panels is disposed in the central region, the panels forming: a pair of outer compartments for receiving air exiting a corresponding one of the pair of laterally spaced vertically stacked chassis; and an inner compartment for receiving air exiting the pair of vertically stacked chassis.

With such an arrangement, the lower chassis are provided with a separate inner compartment for ventilation of the air exiting such lower cabinets; while the upper chassis are provided with the outer compartments for ventilation thereby alleviate backpressure in the central region. The invention equalizes the backpressure that is built up in the central region or chimney. This allows the lower ⅔ of the chassis in the rack to exhaust as easily as the chassis in the top of the rack. This eliminates any need to overbuild the cooling systems and does not require any extra space within the rack.

In one embodiment, the panels have therein an array of openings in a lower portion thereof for passing portions of air in the outer compartments into the inner compartment.

With such an arrangement, the openings provide secondary ducts up the central region that allows various levels of exhaust to bleed into the inner compartment to further alleviate the backpressure.

In one embodiment, an upper portion of the panels inhibits portions of air in the outer compartments from passing into the inner compartment.

In one embodiment, the openings extend in rows horizontally across the panel.

In one embodiment, the number of opening in lower ones of the rows is greater than the number of opening in upper ones of the rows.

In one embodiment, wherein each one of the chassis is disposed on a corresponding one of a plurality of horizontally extending shelves and including a plurality of pivotal flaps, each one of the flaps being disposed in registration with a region of the rear portion of the chassis exiting the air, such flap being biased in a closed position in the absence of such chassis from the shelve and such flap being biased in an open position when such chassis is present on the shelve to enable the air to exit the chassis and the pass through the open flap into the central region.

The details of one or more embodiments of the invention are set forth in the accompanying drawings and the description below. Other features, objects, and advantages of the invention will be apparent from the description and drawings, and from the claims.

DESCRIPTION OF DRAWINGS

The above and further advantages of this invention may be better understood by referring to the following description in conjunction with the accompanying drawings, in which like numerals indicate like structural elements and features in the various figures. The drawings are not meant to limit the scope of the invention. For clarity, not every element may be labeled in every figure. The drawings are not necessarily to scale, emphasis instead being placed upon illustrating the principles of the invention.

Like reference symbols in the various drawings indicate like elements.

DETAILED DESCRIPTION

Figure 1:
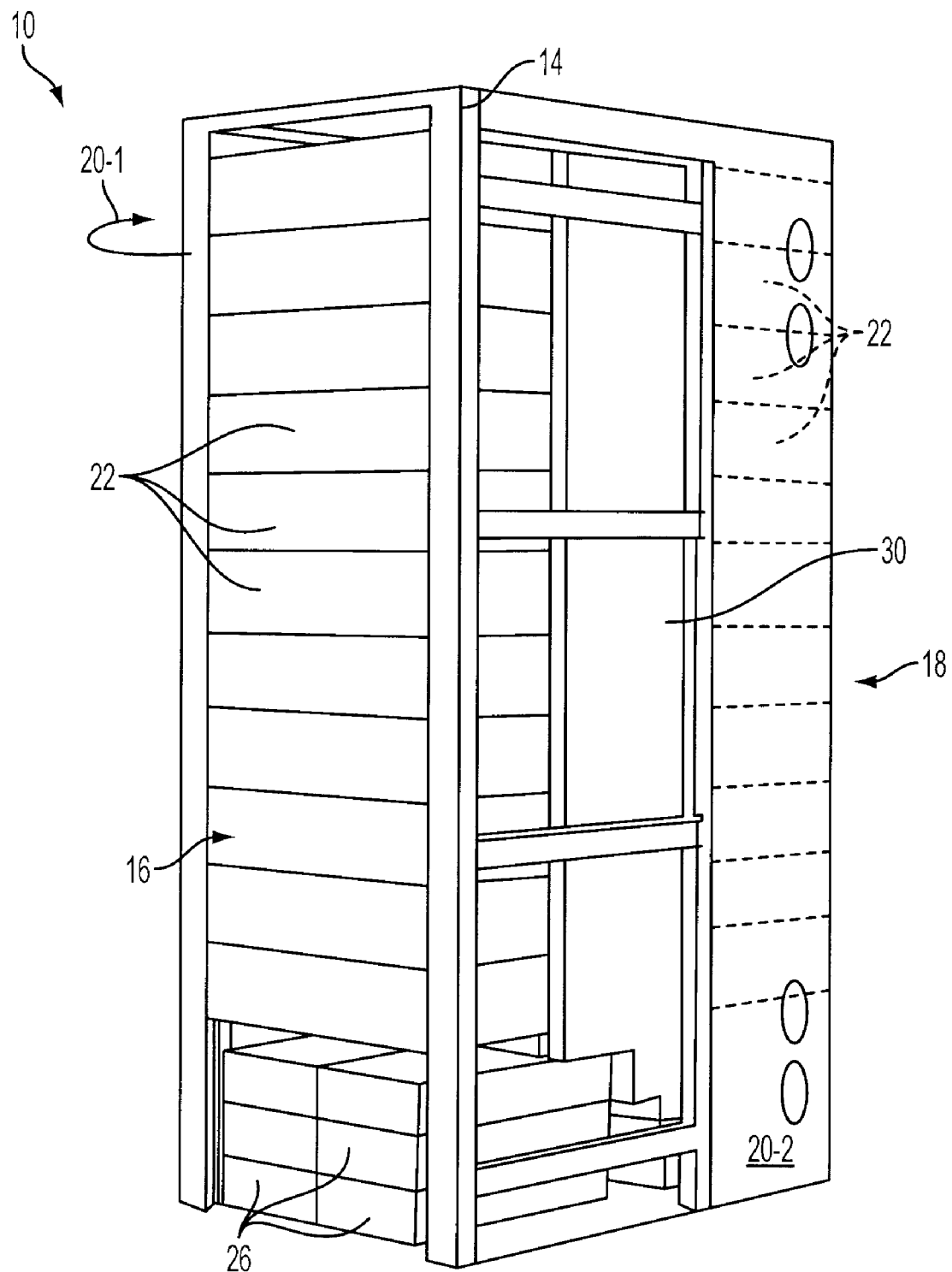
FIG. 1 is a schematic diagram of an embodiment of a cabinet for a data storage system constructed in accordance with the invention.
Figure 2:
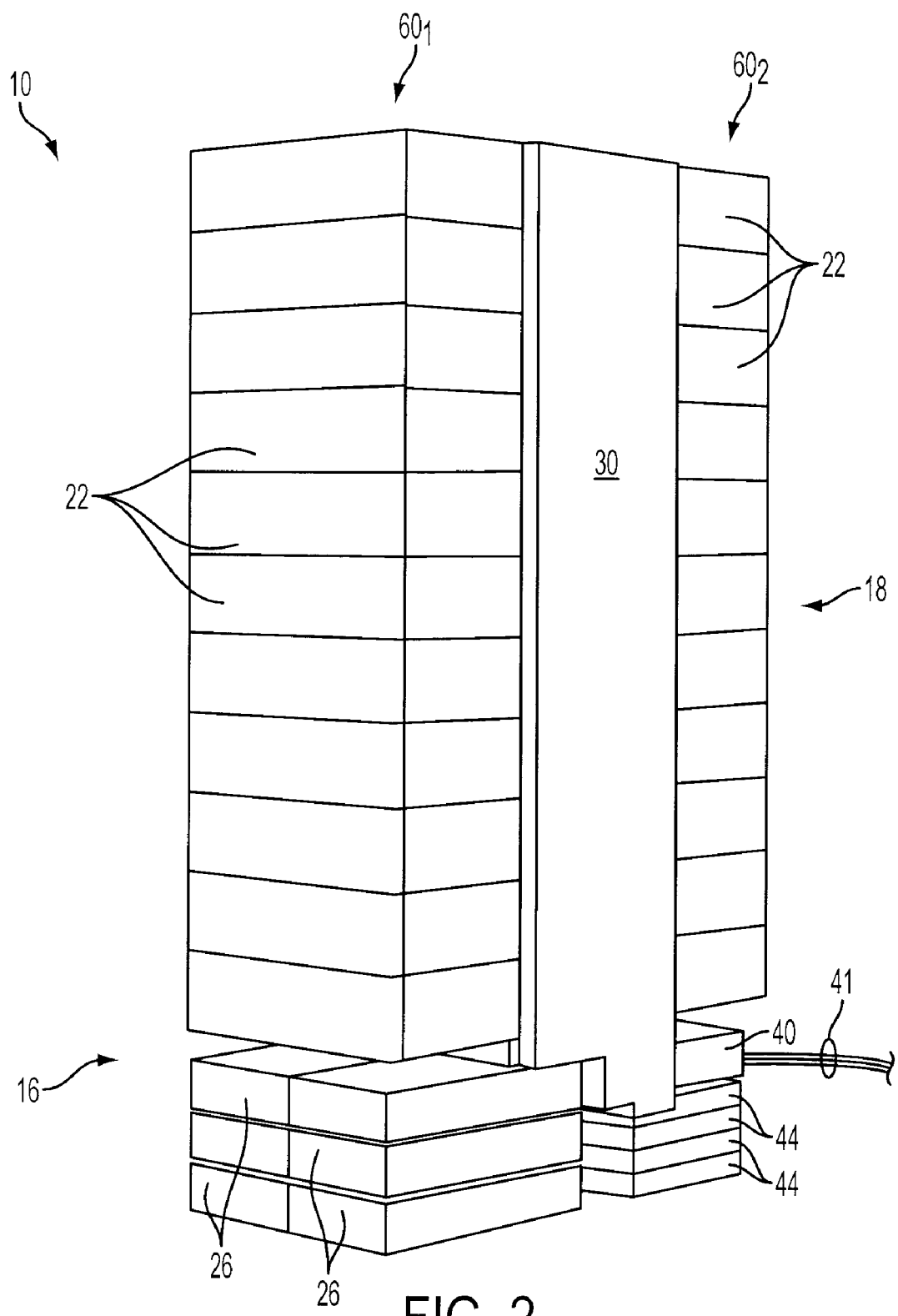
FIG. 2 is a schematic diagram of the cabinet of FIG. 1, without a rack structure.
Figure 3:
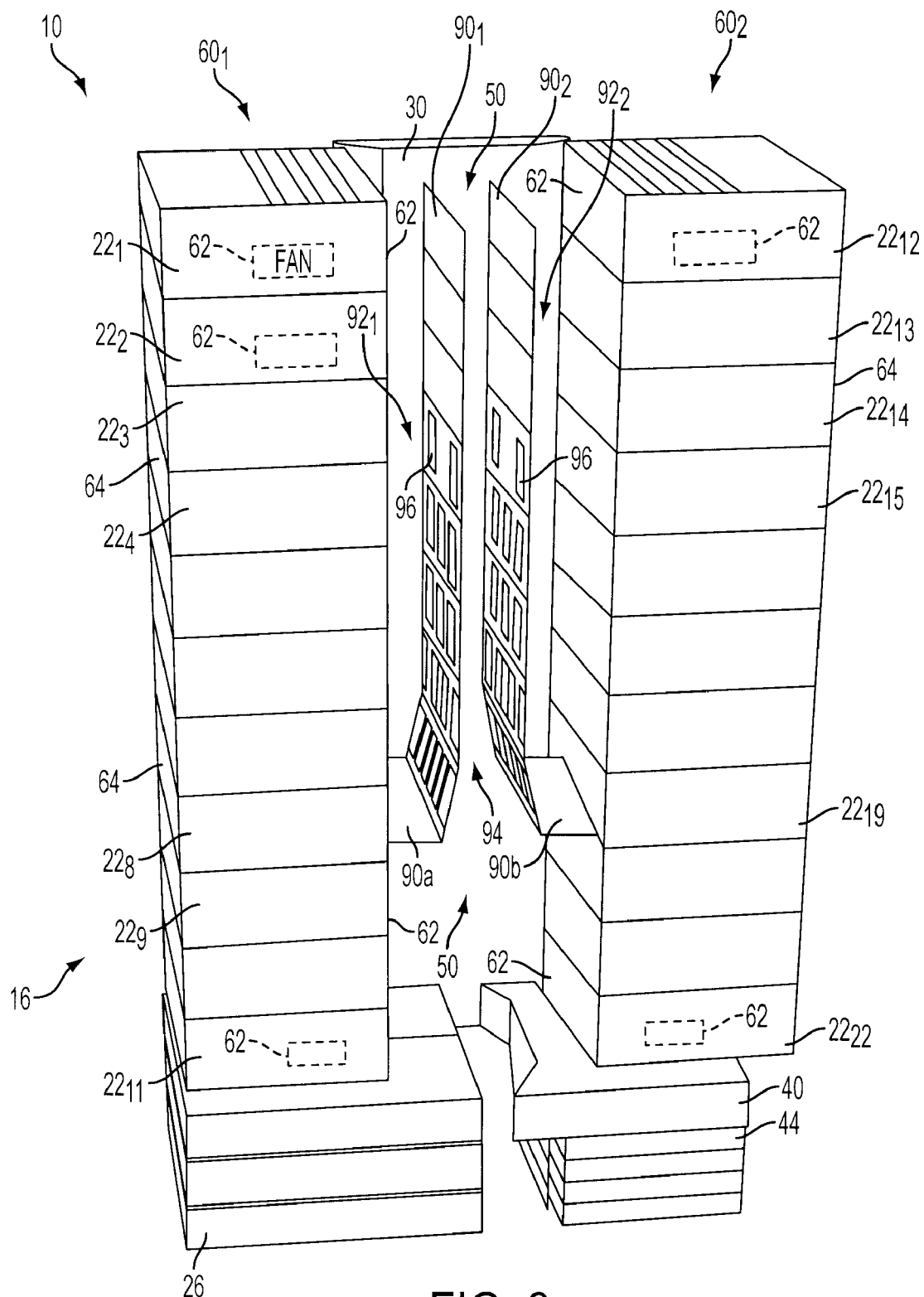
FIG. 3 is a schematic diagram of the interior portion of the cabinet of FIG. 2 chimney in accordance with the invention.

Referring now to FIGS. 1 through 3, a cabinet 10 is shown for a data storage system having a rack 14 with a front side 16, a rear side 18, and opposing sidewalls 20-1, 20-2. In FIG. 2, the rack 14 in FIG. 1 is missing to illustrate more clearly the various internal features of the cabinet 10. In one embodiment, the rack 14 is constructed of sheet metal and has a 24" width, a 39" length, and a 42 U height (1 U is equal to 1.75 inches). Other embodiments of racks may have different heights, widths, and depths.

Mounting or guide rails (not shown) define front compartments for guiding and supporting chassis installed through the front side 16 and rear compartments for guiding and supporting chassis installed through the rear side 18. The placement of such rails can vary during system manufacture to accommodate the varying sizes (e.g., 3 U, 2 U, etc.) of chassis used to populate the cabinet 10. Accordingly, as used herein, a compartment describes a position in the rack configured for receiving a chassis. Mounting rails, doors, cover, floor, and side panels of the cabinet 10 are not shown to simplify the illustration.

Installed within the rack 14 are front-side disk array enclosures (DAEs), herin refereed to as chassis 22, also called data storage chassis, rear-side DAEs 22 (shown in dashed lines), a plurality of power supplies 26, a first vertical spine 30 located adjacent the sidewall 20-2, a second vertical spine located adjacent the sidewall 20-1 (both not visible), a patch panel 40 (FIG. 2), and a plurality of power regulators 44 (FIG. 2). A general reference to a chassis, as used herein, can refer to any one or more of the DAEs chassis 22, power supplies 26, patch panel 40, and power regulators 44. Each chassis 22, 26, 40, 44 is a field replaceable unit (FRU) and is individually serviceable from its front end when installed in the rack 14.

In the cabinet 10, the DAE chassis 22 are modular, each having a plurality of redundant disk drives (divided into side A and side B), a front side, a rear side, rear cabling, and front-to-rear cooling. At the rear of each DAE chassis 22 are an electrical signal connector and electrical plug that "hot" plug into respective cable assemblies on the vertical spines 30, as described in more detail below. For some embodiments of DAE chassis 22, the disk drives are individually serviceable within the DAE. In one embodiment, each DAE chassis 22 has a 3 U height and 12" depth.

In FIG. 1 and FIG. 2, the front and rear compartments reserved for DAE chassis 22 are fully populated: on the front side 16, a first stack $60_1$ of DAE chassis 22 is disposed above the power supplies 26; at the rear side 18, a second stack $60_2$ of DAEs 22 is disposed above the patch panel 40 and power regulators 44. A gap (approx. 1 U) separates each stack of DAEs from the patch panel 40 or power supplies 26. Although shown fully populated with DAE chassis 22, the cabinet 10 can operate with as few as a single DAE chassis 22. The modular construction of the cabinet 10 and its various FRUs allows the addition of DAE chassis 22 on an as-needed basis.

The patch panel 40 is an individual chassis having various modules for defining the functional behavior of the data storage system. Depending upon the particular types of modules in use, the DAE chassis 22 of the data storage system can operate, for example, as a Network Application Storage system, as a Storage Area Network, or as a combination thereof. Egress and ingress of communication signals out of and into the data storage system 10 is through the patch panel 40 over cabling 41. A source of power can enter the data storage system 10 from below (e.g., into the power regulators 44). The electrical interconnections are described in more detail in pending U.S. patent application Ser. No. 11/536,044, Title: BACK-TO-BACK DATA STORAGE SYSTEM, filed: Sep. 28, 2006, Inventors: W. Brian Cunningham, Joseph P. King, Jr. and C. Ilhan Gundogan, assigned to the same assignee as the present invention, the subject matter thereof being incorporated herein by reference.

FIG. 3 shows a side view of the cabinet 10 with the spine 30 removed to reveal a central region 50 (i.e., a chimney (or air plenum)) shown and to be described in more detail in connection with FIG. 5. Suffice it to say here that the cabinet 10 includes the first plurality $60_1$ of vertically stacked chassis 22, here labeled as chassis $22_1$-$22_{11}$; the second plurality $60_2$ of vertically stacked chassis 22 here labeled as chassis $22_2$-$22_{22}$. Rear portions 52 of the first plurality of vertically stacked chassis and second plurality of vertically stacked chassis have the central, vertically extending region, or chimney, 50 between the first plurality of vertically stacked chassis $60_1$ and the second plurality of vertically stacked chassis $60_2$.

Figure 5:
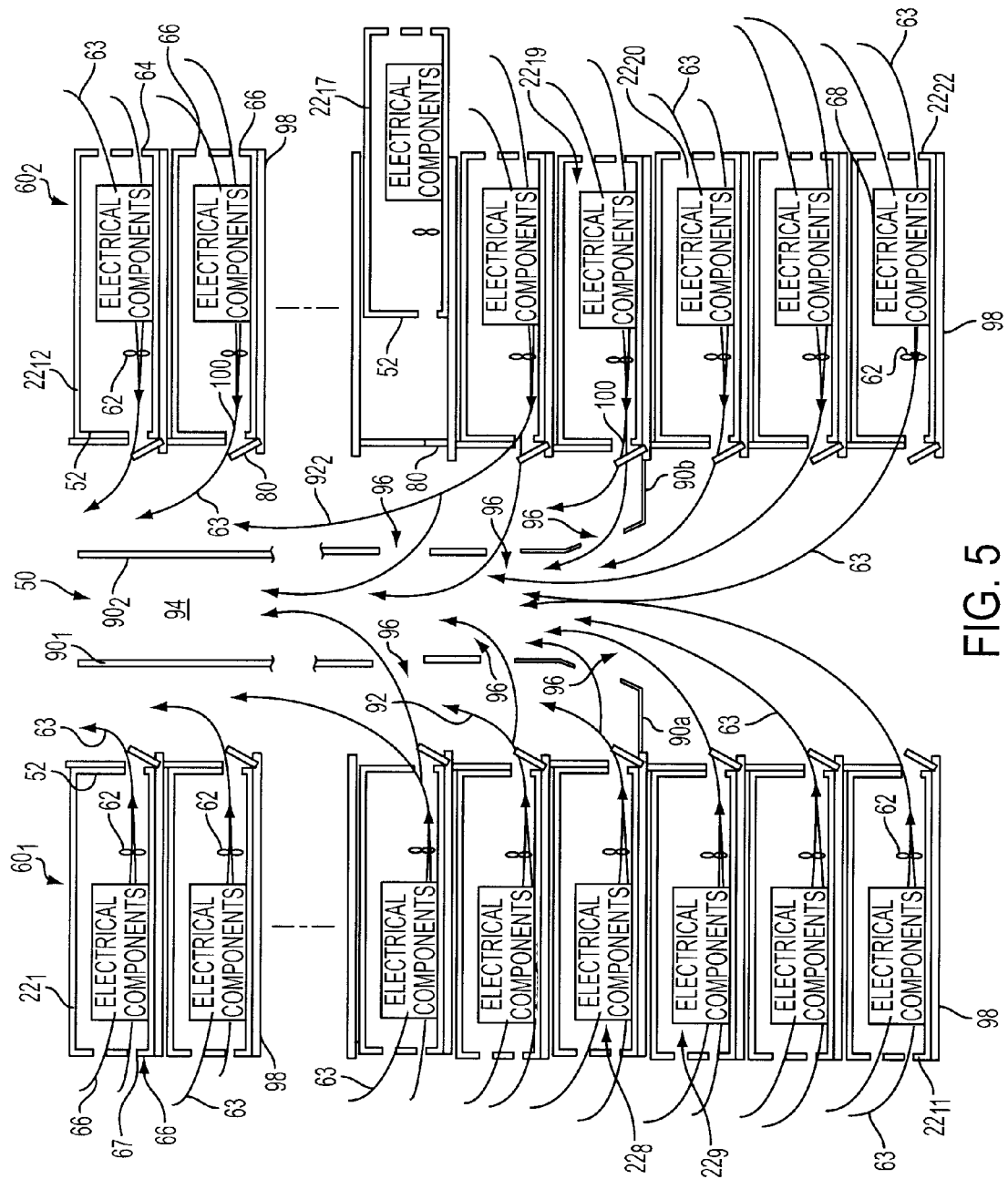
FIG. 5 is a diagrammatical side elevation view of the interior portion of the cabinet of FIG. 2 showing airflow through the chassis into the common chimney in accordance with the invention.

Referring also to FIG. 5, each one of the chassis $22_1$-$22_{22}$ has therein: a fan 62, such fan 62 directing air, indicated by arrows 63, entering a front portion 64 of the chassis $22_1$-$22_{22}$ through openings 66 in the rear portion 52 of the chassis $22_1$-$22_{22}$ to cool the electrical components 68 in the chassis, and then exit into the central, vertically extending region 50. It is noted that in FIG. 5, chassis $22_{17}$ is shown in this example removed from the stack. It is understood that such chassis $22_{17}$ may be included in the stack $60_2$, is removed here to explain the operation of flaps 80, to be described.

Figure 4:
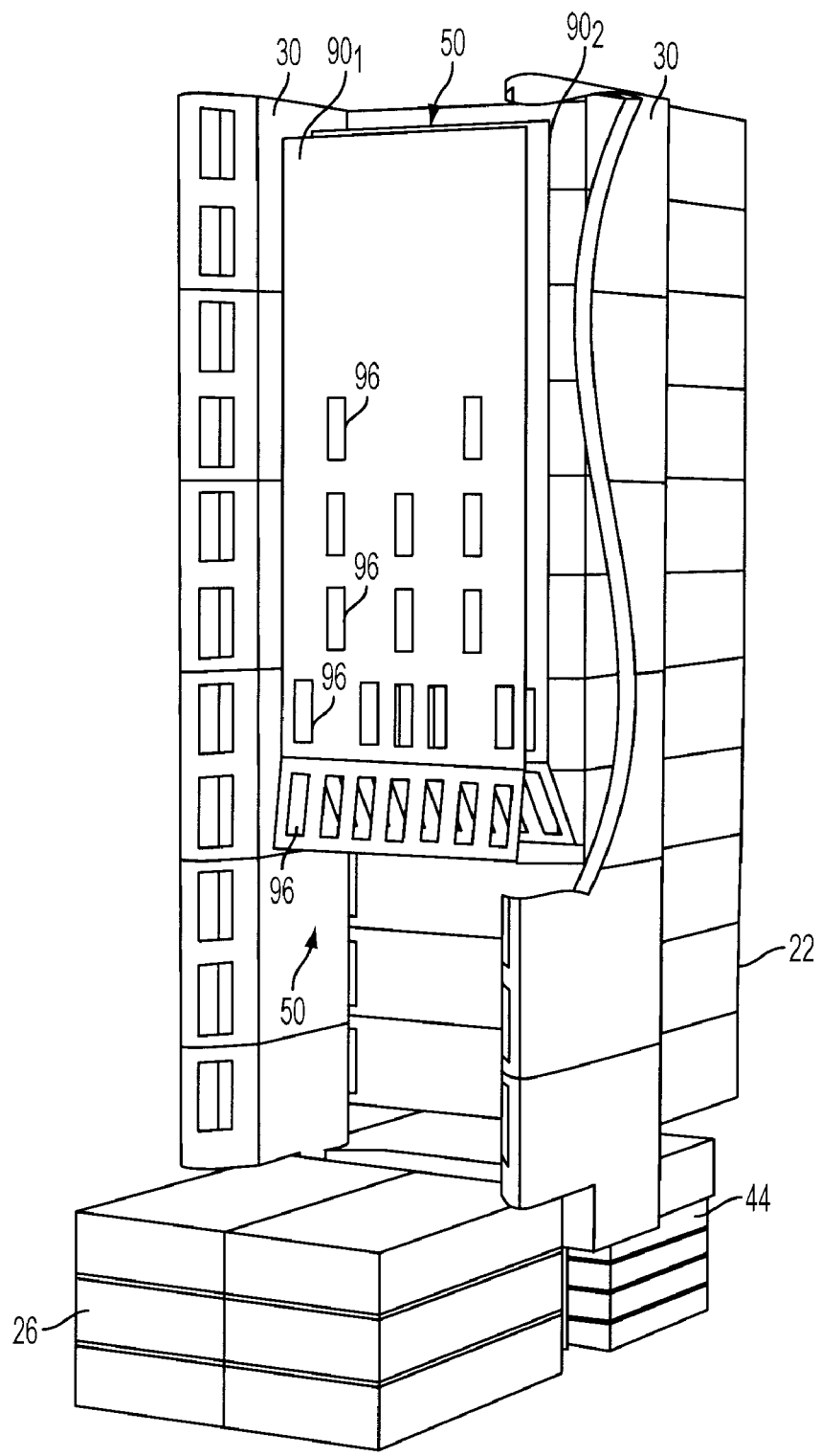
FIG. 4 is a schematic diagram of the cabinet of FIG. 2 with portions of chassis stored therein removed and with a portion of a sidewall of the cabinet partially broken away chimney in accordance with the invention.

Referring to FIGS. 3, 4 and 5, a pair of laterally spaced, vertically extending panels $90_1$, $90_2$ is disposed in the central, vertically extending region 50, the panels forming: a pair of outer compartments $92_1$, $92_2$ for receiving air exiting the rear portion 52 of an upper portion of the first plurality of vertically stacked chassis, here exiting chassis $22_1$-$22_8$, and the second plurality of vertically stacked chassis, here exiting chassis $22_{12}$-$22_{19}$, and an inner compartment 94 for receiving air exiting the rear portion of a lower portion of both the first plurality of vertically stacked chassis and the second plurality of vertically stacked chassis, here exiting chassis $22_9$-$22_{11}$ and $22_{20}$-$22_{22}$. It is noted that each one of the panels $90_1$, $90_2$ terminates at lower regions thereof into regions $90a$, $90b$ (FIGS. 3 and 5) and extends transverse, here horizontally, to the vertically extending portion of such one of the panels $90_1$, $90_2$. Thus, the outer compartment $92_1$ extends down to chassis $22_8$ and the outer compartment $92_2$ extends down to chassis $22_{19}$.

Each one of the vertically extending panels $90_1$ and $90_2$ has therein an array of openings 96 for passing portions of air from the outer compartments $92_1$, $92_2$ into the inner compartment 94 as shown in FIG. 5. It is noted that the array of openings 96 is in the lower portion (the portions opposite from chassis $22_4$-$22_8$ and $22_{15}$-$22_{19}$) for passing portions of air from the outer compartments $92_1$, $92_2$ into the inner compartment 94 with the upper portion of such pair of panels (the (the portions opposite from chassis $22_1$-$22_3$ and $22_{11}$-$22_{14}$) being absent of such openings to inhibit portions of air in the outer compartments $92_1$, $92_2$ from passing into the inner compartment 94.

As shown in FIG. 5, each one of the chassis $22_1$-$22_{22}$ is disposed on a corresponding one of a plurality of horizontally extending shelves 98. Each one of the shelves has mounted to it one of the pivotal flaps 80 referred to above. Each one of the flaps 80 is disposed in registration with a region 100 of the rear portion of the chassis exiting the air. The flap 80 is biased by a spring, not shown, in a closed position in the absence of such chassis (as shown in this example for chassis $22_{17}$) from the shelve and such flap being biased (here forced to the open position by engagement of the rear portion of the chassis) in an open position when such chassis is present on the shelve (as shown for the other chassis in FIG. 5) to enable the air to exit the chassis and the pass through the open flap 80 into the central region 50. Referring again to FIGS. 3 and 4, it is noted that the openings 96 extend in rows horizontally across the panel, and that the number of opening 96 in lower ones of the rows is greater than the number of opening 96 in upper ones of the rows. The number of openings and distribution is a function of the number chassis in each stack and the size and airflow rate through the chassis as well as the size and volumetric space of the common region.

A number of embodiments of the invention have been described. Nevertheless, it will be understood that various modifications may be made without departing from the spirit and scope of the invention. For example, the number of chassis in each one of the stacks may be more or less than that shown. Also, the number of openings and distribution may be different from that shown and is a function of the number chassis in each—the size and airflow rate through the chassis as well as the size and volumetric space of the common region. Also, the flap mechanism may be of any convenient design. Accordingly, other embodiments are within the scope of the following claims.

What is claimed is:

1. A cabinet having an opening in an external surface thereof for exhausting air passing through the cabinet externally of the cabinet, such opening having a pair of outer regions and an inner region disposed between the pair of outer regions, such cabinet comprising:
   a pair of vertically stacked chassis separated by a central, vertically extending region;
   a pair of laterally spaced, vertically extending panels disposed in the central region, such panels forming:
      a pair of vertically extending outer compartments for receiving air exiting a corresponding one of the pair of laterally spaced vertically stacked chassis, such pair of outer compartments having open ends terminating at the pair of outer regions of the opening for directing the air received therein vertically towards the opening, such received air exiting through the open ends of the pair of outer regions of the openings; and
      a vertically extending inner compartment disposed between and parallel to the pair of vertically extending outer compartments having an open end terminating at the inner region of the opening for receiving air exiting the pair of vertically stacked chassis and for directing the air received therein vertically towards the opening, such received air exiting through the open ends of the inner region of the opening; and
   wherein each one of the vertically extending panels has therein an array of openings for passing portions of air from the outer compartments into the inner compartment.

2. A cabinet having an opening in an external surface thereof for exhausting air passing through the cabinet externally of the cabinet, such opening having a pair of outer regions and an inner region disposed between the pair of outer regions, such cabinet comprising:
   a pair of vertically stacked chassis separated by a central, vertically extending region;
   a pair of laterally spaced, vertically extending panels disposed in the central region, such panels forming:
      a pair of vertically extending outer compartments for receiving air exiting a corresponding one of the pair of laterally spaced vertically stacked chassis, such pair of outer compartments having open ends terminating at the air of outer regions of the opening for directing the air received therein vertically towards the opening, such received air exiting through the open ends of the pair of outer regions of the openings; and
      a vertically extending inner compartment disposed between and parallel to the pair of vertically extending outer compartments having an open end terminating at the inner region of the opening for receiving air exiting the pair of vertically stacked chassis and for directing the air received therein vertically towards the opening, such received air exiting through the open ends of the inner region of the opening; and
   wherein each one of the vertically extending panels has therein an array of openings in a lower portion thereof for passing portions of air from the outer compartments into the inner compartment and wherein an upper portion of such pair of panels is void of such openings to inhibit portions of air in the outer compartments from passing into the inner compartment.

3. A cabinet having an opening in an external surface thereof for exhausting air passing through the cabinet externally of the cabinet, such opening having a pair of outer regions and an inner region disposed between the pair of outer regions, such cabinet comprising:
   a first plurality of vertically stacked chassis;
   a second plurality of vertically stacked chassis;
   rear portions of the first plurality of vertically stacked chassis and second plurality of vertically stacked chassis having a central, vertically extending region between the first plurality of vertically stacked chassis and second plurality of vertically stacked chassis;
   each one of the chassis having therein:
      a fan, such fan directing air entering a front portion of the chassis through an opening in the rear portion of the chassis to thereby exit into the central, vertically extending region;
      a pair of laterally spaced, vertically extending panels disposed in the central, vertically extending region, the panels forming:
         a pair of vertically extending outer compartments for receiving air exiting the rear portion of an upper portion of the first plurality of vertically stacked chassis and the second plurality of vertically stacked chassis, such pair of outer compartments having open ends terminating at the pair of outer regions of the opening for directing the air received therein vertically towards the opening such received air exiting through the open ends of the pair of outer regions of the opening; and
         a vertically extending inner compartment disposed between and parallel to the pair of vertically extending outer compartments having an open end terminating at the inner region of the opening for receiving air exiting the rear portion of a lower portion of both the first plurality of vertically stacked chassis and the second plurality of vertically stacked chassis and for directing the air received therein vertically towards the opening, such received air exiting through the open ends of the inner region of the opening; and
      wherein each one of the vertically extending panels has therein an array of openings for passing portions of air from the outer compartments into the inner compartment.

4. A cabinet having an opening in an external surface thereof for exhausting air passing through the cabinet externally of the cabinet, such opening having a pair of outer regions and an inner region disposed between the pair of outer regions, such cabinet comprising:
   a first plurality of vertically stacked chassis;
   a second plurality of vertically stacked chassis;
   rear portions of the first plurality of vertically stacked chassis and second plurality of vertically stacked chassis having a central, vertically extending region between the first plurality of vertically stacked chassis and second plurality of vertically stacked chassis;
   each one of the chassis having therein:
      a fan, such fan directing air entering a front portion of the chassis through an opening in the rear portion of the chassis to thereby exit into the central, vertically extending region;
      a pair of laterally spaced, vertically extending panels disposed in the central, vertically extending region, the panels forming:

a pair of vertically extending outer compartments for receiving air exiting the rear portion of an upper portion of the first plurality of vertically stacked chassis and the second plurality of vertically stacked chassis, such pair of outer compartments having open ends terminating at the pair of outer regions of the opening for directing the air received therein vertically towards the opening such received air exiting through the open ends of the pair of outer regions of the opening; and a vertically extending inner compartment disposed between and parallel to the pair of vertically extending outer compartments having an open end terminating at the inner region of the opening for receiving air exiting the rear portion of a lower portion of both the first plurality of vertically stacked chassis and the second plurality of vertically stacked chassis and for directing the air received therein vertically towards the opening, such received air exiting through the open ends of the inner region of the opening; and wherein each one of the vertically extending panels has therein an array of openings in a lower portion thereof for passing portions of air from the outer compartments into the inner compartment and wherein an upper portion of such pair of panels is void of such opening to inhibit portions of air in the outer compartments from passing into the inner compartment.

5. The cabinet recited in claim 3 wherein each one of the panels terminate at lower regions thereof into regions extending transverse to the vertically extending portion of such one of the panels.

6. The cabinet recited in claim 3 wherein each one of the chassis is disposed on a corresponding one of a plurality of horizontally extending shelves and including a plurality of pivotal flaps, each one of the flaps being disposed in registration with a region of the rear portion of the chassis exiting the air, such flap being biased in a closed position in the absence of such chassis from the shelve and such flap being biased in an open position when such chassis is present on the shelve to enable the air to exit the chassis and to pass through the open flap into the central region.

7. The cabinet recited in claim 4 wherein the openings extend in rows horizontally across the panel, and wherein the number of opening in lower ones of the rows is greater than the number of opening in upper ones of the rows.

8. The cabinet recited in claim 7 wherein each one of the panels terminate at lower regions thereof into regions extending transverse to the vertically extending portion of such one of the panels.

9. The cabinet recited in claim 8 wherein each one of the chassis is disposed on a corresponding one of a plurality of horizontally extending shelves and including a plurality of pivotal flaps, each one of the flaps being disposed in registration with a region of the rear portion of the chassis exiting the air, such flap being biased in a closed position in the absence of such chassis from the shelve and such flap being biased in an open position when such chassis is present on the shelve to enable the air to exit the chassis and the pass through the open flap into the central region.

10. The cabinet recited in claim 1 wherein the pair of laterally spaced, vertically extending panels having a bottom above at least one of the chassis.

11. The cabinet recited in claim 2 wherein the pair of laterally spaced, vertically extending panels having a bottom above at least one of the chassis.

12. The cabinet recited in claim 3 wherein the pair of laterally spaced, vertically extending panels having a bottom above at least one of the chassis.

13. The cabinet recited in claim 4 wherein the pair of laterally spaced, vertically extending panels having a bottom above at least one of the chassis.

14. A cabinet having an opening in an external surface thereof for exhausting air passing through the cabinet externally of the cabinet, such opening having a pair of air exhaust regions regions, such cabinet comprising:

a plurality of vertically stacked chassis;

a vertically extending panel disposed with the cabinet rearward of at least a portion of the chassis, such panel forming a pair of vertically extending chimneys, each one of the chimneys receiving different portions of air exiting the chassis and directing the different portions of the received air externally of the cabinet through a corresponding one of the exhaust regions of the opening; and wherein the vertically extending panel has therein an array of openings for passing portions of air from one of the pair of chimneys closer to the chassis to the other one of the pair of chimneys and wherein an upper portion of the panel is void of such opening to inhibit portions of air in the one of the pair of chimneys closer to the chassis from passing into the other one of the pair of chimneys.

\* \* \* \* \*